United States Patent [19]

Anderson et al.

[11] Patent Number: 4,495,222

[45] Date of Patent: Jan. 22, 1985

[54] METALLIZATION MEANS AND METHOD FOR HIGH TEMPERATURE APPLICATIONS

[75] Inventors: George F. Anderson, Tempe; Dan L. Burt, Phoenix, both of Ariz.

[73] Assignee: Motorola, Inc., Schaumburg, Ill.

[21] Appl. No.: 549,354

[22] Filed: Nov. 7, 1983

[51] Int. Cl.³ ............................................. H01L 21/28
[52] U.S. Cl. ...................................... 427/89; 427/90; 427/102; 427/103
[58] Field of Search .................... 427/89, 90, 102, 103

[56] References Cited

U.S. PATENT DOCUMENTS

| | | |
|---|---|---|
| 3,256,587 | 6/1966 | Hangstefer . |
| 3,585,461 | 6/1971 | Eynon . |
| 3,617,818 | 11/1971 | Fuller . |
| 3,689,332 | 9/1972 | Dietrich .............................. 427/90 |
| 3,761,309 | 9/1973 | Schmitter ........................... 427/92 |
| 3,830,657 | 8/1974 | Farrar ................................. 427/90 |
| 3,840,398 | 10/1974 | Sonntag . |
| 3,935,635 | 2/1976 | Botzenhardt ...................... 29/578 |
| 3,942,187 | 3/1976 | Gelsing .............................. 357/71 |
| 4,005,455 | 1/1977 | Watrous ............................ 357/71 |
| 4,050,965 | 9/1977 | Ipri .................................... 357/91 |
| 4,087,314 | 5/1978 | George .............................. 357/68 |
| 4,151,545 | 4/1979 | Schnepf ............................. 357/71 |
| 4,162,506 | 7/1979 | Takei ................................. 357/71 |
| 4,184,933 | 1/1980 | Morcom ........................ 204/192 EC |
| 4,188,636 | 2/1980 | Sato ................................... 357/71 |
| 4,201,999 | 5/1980 | Howard ............................. 357/67 |
| 4,206,472 | 6/1980 | Chu .................................... 357/67 |
| 4,222,165 | 9/1980 | Hartman ............................ 29/579 |

*Primary Examiner*—John D. Smith
*Attorney, Agent, or Firm*—Robert M. Handy

[57] ABSTRACT

Semiconductor devices with resistor regions, capable of operating at higher temperatures, and having improved bond pull strength are obtained by using a single layer (e.g. Ni—Cr) to act as a combined resistive layer and barrier layer. When placed in the contact windows between the semiconductor (e.g. Si) and the interconnect metallization, (e.g. Al) and Ni—Cr layer acts as a diffusion barrier to prevent interdiffusion of silicon and aluminum and contact alloying punch-through. When placed elsewhere on the device the Ni—Cr layer also serves as thin film resistor material. Wire bond pull strength is improved by placing an adhesion layer (e.g. polysilicon) beneath the portion of the resistive barrier layer underlying the bonding pads. The polysilicon layer rests on the insulator (e.g. SiO₂) covering the semiconductor substrate.

5 Claims, 11 Drawing Figures

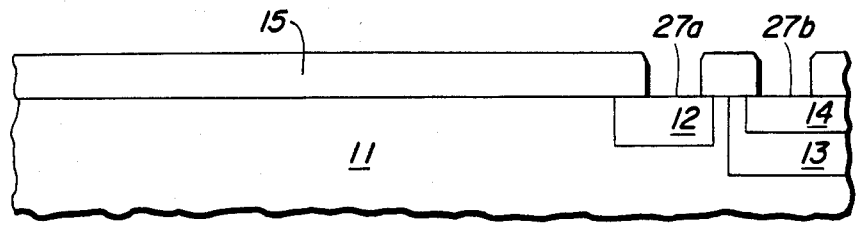
FIG. 3A
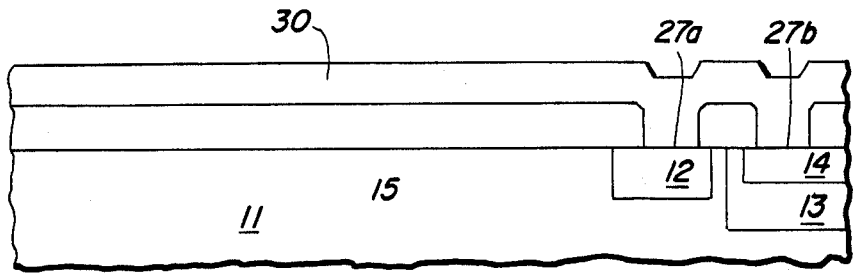
FIG. 3B
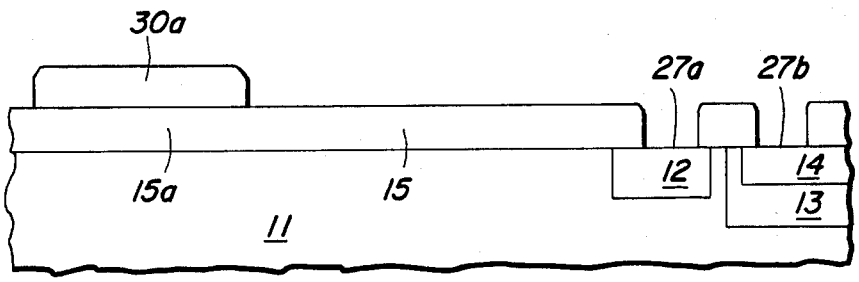
FIG. 3C
FIG. 3D
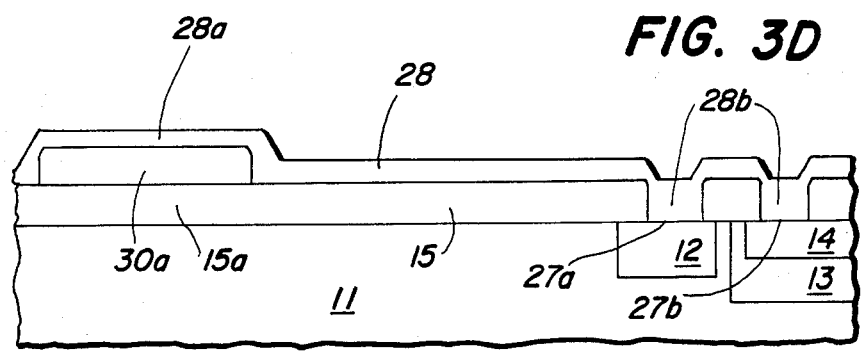

METALLIZATION MEANS AND METHOD FOR HIGH TEMPERATURE APPLICATIONS

BACKGROUND OF THE INVENTION

1. Field of the Invention

This invention relates in general to improved means and method for providing metallization areas on electronic devices, and, more particularly, to improved means and method for providing bonding, resistor, and contact areas on semiconductor devices which must withstand high operating temperatures.

2. Background Art

Electronic devices, particularly semiconductor devices are sensitive to heat. If the devices are exposed to excessive temperatures during manufacturing or use, degradation occurs and the devices fail after a relatively short period of operation. It is generally accepted that most device failure modes are exponentially accelerated as temperature increases. For this reason, many present day semiconductor devices are limited to maximum junction operating temperatures below 100° C. While some devices are able to operate at higher temperatures, e.g., 100° to 150° C., and a few rare devices up to 200° C., these in general do not include a broad range of semiconductor materials or device functions.

With ultra-high speed or ultra-high frequency devices it is often necessary to operate the devices at high current densities. Junction temperature increases as current density increases. As a consequence, very fast devices must be able to tolerate junction temperatures exceeding 150°-200° C. for significant periods of time without excessive degradation. Prior art structures and fabrication methods which provide satisfactory operating life for devices intended for operation in the range below 100° C. or even up to 150° C., no longer are useful for devices which must operate for significant periods above 150° C., particularly above 200° C. For example, contact alloying, emitter punch-through, bond or bonding pad lifting, and resistor degradation occur at an accelerated rate at these temperatures and can unduly shorten device life.

Many high speed devices contain resistors for ballasting or other purposes. It is generally desired that these resistors remain relatively constant with temperature. This restricts the choice of useful resistor materials and can lead to conflicting process requirements, especially as one attempts to deal with other problems such as emitter punch-through from contact alloying. A further complication is the need to have especially robust leads and bonding pads which exhibit high tensile strength, that is, be especially resistant to bond lifting or bonding pad lifting, so that high speed automated assembly equipment may be used. In general the tensile force exerted during bonding increases as the bonding speed is increased.

Thus, there is a need for improved means and methods for electronic devices, particularly, semiconductor devices which must operate at high temperatures and where conflicting requirements exist with respect to bond strength, process economy, contact alloying and punch-through, and temperature stable resistors, and where these conflicting requirements must be simultaneously satisfied.

Accordingly, it is an object of the present invention to provide an improved means and method for obtaining high strength bonds to electronic devices.

It is a further object of the present invention to provide an improved means and method for obtaining metal semiconductor contacts which are substantially free of alloying punch-through.

It is an additional object of the present invention to provide an improved means and method for obtaining integrated resistors on device structures.

It is a further object of the present invention to provide an improved means and method for avoiding bonding pad lifting in devices employing resistor films, particularly where such resistor films underlie the bonding pads.

It is a still further object of the present invention to provide an improved means and method for achieving the above objectives simultaneously.

SUMMARY OF THE INVENTION

These and other objects and advantages are achieved through the present invention wherein there is provided a substrate of a material suitable for forming semiconductor devices; an insulating layer overlying the substrate for supporting a bonding pad and isolating it from the substrate; an adhesion layer overlying and in contact with the insulating layer, and of a material comprising an element in common with the insulating layer to promote chemical bonding thereto; a bonding pad layer overlying the adhesion layer and of a material adapted to readily form metallurgical bonds to an external bonding means; and a barrier layer intermediate between the bonding pad layer and the adhesion layer and of a material adopted to form intermetallic compounds with the adhesion layer to promote adhesion thereto, and adapted to prevent substantial interdiffusion and alloying of the substrate material and the bonding pad layer material when interposed therebetween.

There is further provided a process for forming bonding pads on a substrate of an electrical device having a resistive barrier layer beneath the pads, comprising inserting between the substrate and the resistive barrier layer an adhesion layer of a material which forms intermetallic compounds with the resistive barrier layer and includes an element in common with the substrate.

Where the device is a semiconductor device and the substrate is silicon with an insulating surface layer of $SiO_2$ and/or $Si_3N_4$, Ni-Cr provides a convenient resistor film and barrier layer for use with Al metallization. The Ni-Cr layer also prevents alloying punch-through which would otherwise occur at the Al-Si interface. A polycrystalline silicon layer is used as the adhesion layer between the oxidized and/or nitrided Si surface and the Ni-Cr layer under the portion of the Al layer used for the bonding pad.

BRIEF DESCRIPTION OF THE DRAWINGS

FIGS. 3A-H illustrate in schematic form, the fabrication sequence of the devices of FIGS. 2A-B, according to the present invention.

FIGS. 1-3 represent only a small portion of a semiconductor device or integrated circuit, which in its entirety may contain a multiplicity of such regions. As used herein the word "device" is intended to refer to the electrical component or integrated circuit as a whole, while the words "device region" are intended to refer to portions or regions within the body of the overall device which contribute to the active device behavior.

DETAILED DESCRIPTION OF THE PREFERRED EMBODIMENT

For convenience, the present invention is illustrated in terms of a silicon semiconductor device or integrated circuit. Those of skill in the art will understand that the description is not limited to silicon per se but applies to other semiconductor materials, as well as to other device structures in which similar performance requirements and compatibility problems are encountered.

Figure 1:
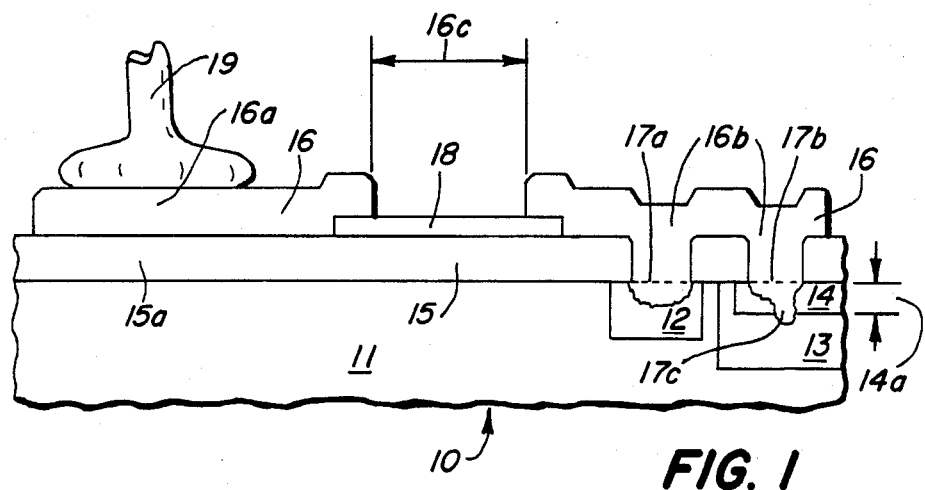
FIG. 1 shows in schematic form, a sectional view of a prior art semiconductor device having a resistor region and a bonding pad.

FIG. 1 shows prior art device 10 having silicon body 11 containing various doped regions 12–14 of varying conductivity type. Doped regions 12–14 which are device regions within body 11, are formed by techniques well-known in the art. By way of a non-limiting example, body 11 is N-type, regions 12 and 13 are P-type and region 14 is N-type. The particular choice of doping type is not critical to the present invention. Body 11 is covered by insulating layer 15 typically of silicon dioxide, silicon nitride, or a combination thereof. Metallization layer 16, typically aluminum, has bonding pad portion 16a for receiving bonding wire 19, and contact portion 16b for contacting doped regions 12 and 14 in ohmic contact windows 17a and 17b. Gold covered Ti-W may also be used for layer 16. Resistive material layer 18 is provided in gap 16c between metallization portions 16a–b. Ni-Cr is suitable for use as resistive material layer 18. Ni-Cr is known to have a resistivity greater than $1.0 \times 10^{-4}$ ohm-cm, and to be readily fabricated as a thin film having sheet resistivities of 8 to 40 ohms per square.

The structure of FIG. 1 has several disadvantages. For example, when pure aluminum is used in direct contact with silicon, substantial alloying of the aluminum into the silicon take place in contact windows 17a–b. This is because silicon is readily soluble in aluminum up to about 1.5%. Thus when the device is exposed to elevated temperatures, e.g. above 150°–200° C., for extended periods of time during manufacturing or use, a silicon-aluminum alloy forms by solid-solid diffusion which consumes substantial amounts of silicon. Where depth 14a of doped region 14 under the contact window 17b is relatively thin, then alloyed region 17c can punch-through thin doped region 14 causing a short circuit to underlying device region 13. This often occurs at emitter regions and is particularly troublesome in ultra-high frequency and ultra-high speed devices where the emitter regions are extremely thin.

In the prior art, emitter alloying punch-through has been avoided by using silicon doped aluminum metallization, that is aluminum with about 1.5% silicon. At this concentration, Al-Si alloy has its lowest melting point. With silicon doped aluminum metallization, much less silicon from body 11 or doped regions 12–14 dissolves in metallization 16 and the incidence of alloying punch-through, as for example at region 17c, is much reduced. However, silicon doped aluminum metallization cannot be used in all situations, since when the metallization is etched into the desired interconnect pattern, there is a tendency for the silicon doping to segregate and remain behind as minute unetched particles on the surface of insulator 15. In the parlance of the art these residual particles are called freckles, and must be removed by an additional de-freckling etch step. In certain circumstances, as for example in some ultra-high frequency devices and some ultra-high speed integrated circuits, use of a de-freckling etch is precluded by other process considerations.

It is known that contact alloying punch-through, as for example at 17c, can be avoided by placing a diffusion barrier layer between the semiconductor surface and interconnect metallization layer 16. The barrier layer must be conductive, it must make ohmic contact to both the semiconductor and the interconnect metallization layer, it must be substantially insoluable in the semiconductor with which it is in contact and vice-versa, and it must be substantially impervious to interdiffusion of the semiconductor and the interconnect metallization material at the temperatures of interest. Those of skill in the art will recognize that some reaction or mutual soluability inevitably occurs at a metal-semiconductor interface, otherwise adherent ohmic contacts would not be obtained. However, with barrier materials, the mutual soluability is sufficiently small so that the problem typified by the Al-Si system is not significant. Platinum is a material commonly used as a barrier layer. However, use of known barrier layer metals such as platinum has the disadvantage that additional processing steps are required to apply and pattern the barrier layer material. Moreover, additional elements are introduced into the manufacturing process, which can have undesirable side effects, e.g. as unwanted lifetime killers or dopants.

It has not been previously known that resistor materials such as Ni-Cr also have the property of serving as a barrier layer to prevent interdiffusion of aluminum and silicon and thus prevent contact alloying and punch-through. Use of a single material for the dual purpose of providing localized series resistance within the device and for preventing contact alloying and punch-through between the interconnect metallization and the semiconductor has not previously been accomplished. This dual usage of a single material has substantial manufacturing advantages since it reduces the number of process steps from what would otherwise be required if doped metallization plus a de-freckle etch, or a separate barrier layer material were used. Further, this dual usage of a single material does not require the introduction of additional elements not already present in the process.

Figure 2A:
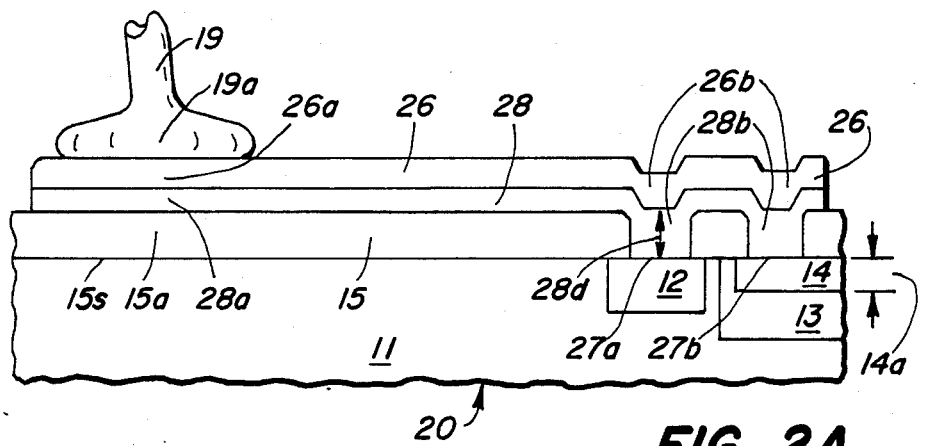
FIGS. 2A-B show in schematic form, a sectional view of an improved semiconductor device having a resistor region and a bonding pad, according to the present invention, and in two embodiments.
Figure 2B:
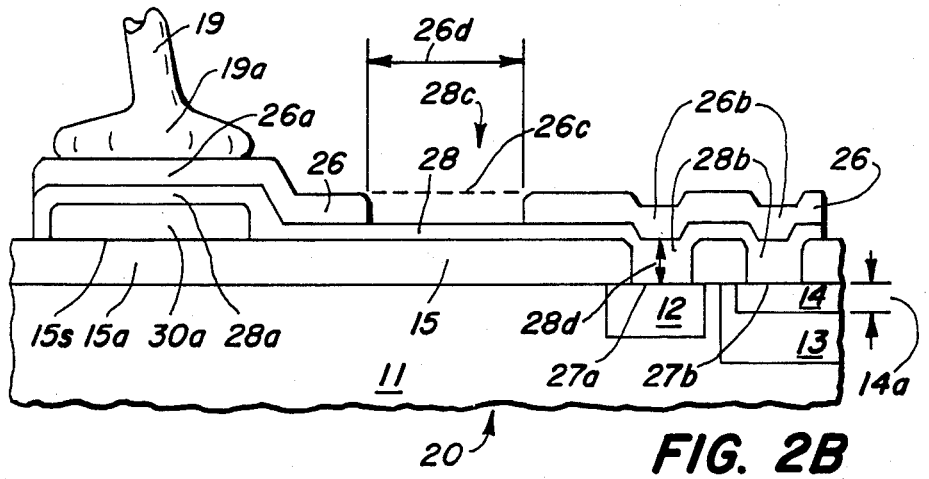

A first embodiment of the invented structure is illustrated in cross-section in FIG. 2A. An additional embodiment is shown in FIG. 2B. Device 20 comprises semiconductor body 11 which contains doped device regions 12–14, and has thereon insulating layer 15 in which contact windows 27a and 27b have been opened to provide access to device regions 12 and 14 respectively. Resistive barrier layer 28 contacts regions 12 and 14 of semiconductor body 11 at 28b in contact windows 27a–b. Metallization layer 26, comprising bonding pad portion 26a and interconnect metallization portion 26b, overlies resistive barrier layer 28. Metallization layer 26 also serves as the bonding layer in pad portion 26a.

Metallization layer 26 has portion 26c optionally removed (see FIG. 2B) in gap 26d to thereby create resistor region 28c in resistive barrier layer 28. Except for resistor region 28c and contacts 28b, current flow between external lead 19 and device regions 12 and 14 takes place primarily through metallization layer 26 rather than resistive barrier layer 28, since layer 26 has a lower resistivity than layer 28.

Where body 11 is of silicon and metallization layer 26 is of aluminum, Ni-Cr has been found to be suitable for resistive barrier layer 28, even when exposed to temperatures in the range of 500°-550° C. during subsequent processing. Useful proportions of Ni-Cr are 20% Ni:80% Cr to 45% Ni:55% Cr. Where metallization 26 is of gold/Ti-W, the Ti-W acts as a barrier to prevent alloying of underlying materials with the gold. Useful proportions of Ti-W are 10% Ti:90% W to 15% Ti:85% W. Insulating layer 15 is conveniently formed from $SiO_2$, $Si_3N_4$, or combinations thereof.

Additional contact resistance is introduced when barrier layer 28 is used to contact device regions 12 and 14 as opposed to having metallization 26 contact them directly. However, this additional contact resistance is generally insignificant since current flows vertically through layer portion 28b from device regions 12, 14 to interconnect metallization 26b, and thickness 28d of layer 28 is only a few thousand Angstrom units or less.

It is desirable for processing convenience to have resistive barrier layer 28 everywhere underlie metallization layer 26. This permits, for example, the two layers to be produced in a single reactor without intermediate exposure of layer 28 to air before deposition of layer 26. This avoids interlayer oxidation and contact problems, which if present substantially reduce manufacturing yield. Under these circumstances resistive barrier layer 28 has portion 28a underlying bonding pad region 26a of metallization layer 26. This arrangement is shown, for example, in FIG. 2A. Ni-Cr has been used extensively as resistive layer in electronic devices without apparent adhesion problems, and has generally been considered to have good adhesion to glasses, oxides, and nitrides, such as $SiO_2$ and/or $Si_3N_4$.

It has been discovered that Ni-Cr, when used for layer 28, adheres less tightly to insulator 15 than is required to obtain maximum lead-pull strength for the wire bonds. For example, when the bonding pad structure of FIG. 2A is utilized, that is, when aluminum or gold bonding pad 26a overlies resistive barrier layer 28 of Ni-Cr at 28a on insulator 15 of $SiO_2$ or $Si_3N_4$ at 15a on silicon body 11, then lead-pull failures occur by bonding pad lifting. It is observed that resistive barrier layer portion 28a separates from oxide surface 15s in region 15a. This indicates that the bonding force at surface 15s between layer 28 and insulator 15 is less than the tensile strength of any of the other materials or joints lying between bond wire 19 and semiconductor body 11.

While the adhesion of Ni-Cr to $SiO_2$ and/or $Si_3N_4$ is adequate for most device applications, problems arise when lead 19 is subjected to higher forces, particularly forces which approach the Ni-Cr to $SiO_2$ or $Si_3N_4$ adhesion limit. This situation arises when very high-speed automated bonding equipment is used. As the bonding head moves at high speed from the bonding pad on the device to the bonding post on the package, a larger pull is applied to wire 19 than when the head moves more slowly, as was the case with manual or semi-automated bonding equipment. This causes an increased bond failure rate and lower yield. Thus, it is important in this situation to provide devices which have better and/or more consistent lead-pull strength.

Use of adhesion layers between materials exhibiting otherwise poor adhesion is well-known. For example, chromium is frequently used as an adhesion layer to promote adhesion of materials, such as gold, to glass or oxide surfaces. However, known adhesion promoting materials are often incompatible with other manufacturing steps, or require costly additional manufacturing steps, or have other properties which interfere with their use in ultra-high frequency or ultra-high speed devices or circuits. Therefore it is of great practical importance to have adhesion promoting materials or structures which are both effective and compatible with materials and processes already in use for the devices.

Polycrystalline silicon is much used in semiconductor device manufacture as a conductor and electrical contact material. It is highly compatible with devices based on silicon as the semiconductor. It is known to possess excellent adhesion to insulating materials such as $SiO_2$ and/or $Si_3N_4$. This is believed to occur because silicon is one of the primary constituent elements of $SiO_2$ and $Si_3N_4$, therefore strong chemical bonds are formed between silicon and its own oxide or nitride since silicon is common to both. What has not been known, however, is that polysilicon also bonds exceptionally well to Ni-Cr, that is, to a material that makes relatively weaker bonds to $SiO_2$ and/or $Si_3N_4$. It has been discovered that polycrystalline silicon can be used as an adhesion layer between Ni-Cr resistive barrier materials and insulators such as $SiO_2$ and/or $Si_3N_4$, to increase the bond pull strength to the point where bond failure now occurs by wire breakage or bond lifting as opposed to pad lifting. Bond lifting occurs as a result of tensile failure, usually at the pad-bond interface or within the pad surface, as opposed to between the pad material and any underlying layers. This is generally the maximum bond pull strength which can be achieved for a given wire material and size, and indicates that the tensile strength of the layer and interfaces exceeds the tensile strength of the bonding pad metal and/or bonding wire itself. It is believed that the excellent adhesion properties of polysilicon to Ni-Cr arise from the fact that these materials can form silicides with silicon, thus promoting strong chemical bonding therebetween.

The following table compares the result of bond pull failure tests on the structure of FIG. 2A and FIG. 2B, using aluminum for metallization 26, Ni-Cr for resistive barrier layer 28, $SiO_2$ for insulator 15, and, with and without polysilicon (Poly Si) layer 30 between layer 28 and insulator 15. When the polysilicon layer is used, the bonding pad region has a [Al-(Ni-Cr)-(Poly Si)-$SiO_2$-Si] structure. When the polysilicon layer is not used, the bonding pad region has a [Al-(Ni-Cr)-$SiO_2$-Si] structure. The tests were made in the same way in each case by means well-known in the art, and are believed to give reliable evidence of the relative strength of the bonds. The bonding pads with the polysilicon layer show a substantially lower percentage of failures due to bonding pad lifting. Thus, the use of the polysilicon layer in connection with the Ni-Cr layer reduces or eliminates a significant cause of bond failure.

| WIRE BOND PULL STRENGTH COMPARISON Percentage of Total Wire Bond Failures Due to Bonding Pad Lifting | | |
|---|---|---|
| Test Conditions | With Polysilicon Layer Under Pad | Without Polysilicon Layer Under Pad |
| Manual Bonder | | |
| Base Pads | 0% | 20% |
| Emitter Pads | 0% | 60% |
| Average | 0% | 40% |
| Automatic Bonder | | |
| Base Pads | 0% | 75% |
| Emitter Pads | 13% | 67% |

-continued

WIRE BOND PULL STRENGTH COMPARISON
Percentage of Total Wire Bond Failures Due
to Bonding Pad Lifting

| Test Conditions | With Polysilicon Layer Under Pad | Without Polysilicon Layer Under Pad |
| --- | --- | --- |
| Average | 7% | 71% |

The following is an example of a preferred embodiment of the practice of the method of the present invention. FIGS. 3A–H illustrate different steps in the manufacturing process intended to yield the structures depicted in FIGS. 2A–B. Several variations are also described.

In FIG. 3A, semiconductor body 11, usually in wafer form, has been prepared by means well-known in the art to have doped regions 12, 13, and 14. Insulating layer 15 has been grown or deposited or a combination thereof on the surface of semiconductor body 11, and contact windows 27a and 27b opened to provide access to device regions 12 and 14. Methods for accomplishing this are well-known in the art. $SiO_2$ and/or $Si_3N_4$ are well-known insulating materials useful for insulating layer 15.

In order to form the structure of FIG. 2B, layer 30 of polycrystalline silicon (polysilicon) is deposited on insulator 15 and patterned to leave portion 30a on region 15a in a location where a bonding pad is desired to be formed (see FIGS. 3B–C). Polysilicon layer 30 has a thickness typically in the range 0.05 to 1.0 microns, with 0.1 to 0.2 microns being convenient, and about 0.15 microns being preferred. If the structure of FIG. 2A is desired, for example in some locations on the overall device, then portion 30a of layer 30 is omitted in that location. If the structure of FIG. 2A is desired throughout, then the steps of FIGS. 3B–C can be omitted entirely.

Resistive barrier layer 28 is applied, as in FIG. 3D, to substantially overlie semiconductor body 11 covering polysilicon layer portion 30a, exposed insulator 15, and contact windows 17a–b. Ni-Cr in proportion 20% Ni:80% Cr to 45% Ni:55% Cr is useful, with 30% Ni:70% Cr to 40% Ni:60% Cr being convenient, and 40% Ni:60% Cr being preferred for resistive barrier layer 28. In the useful range, the Ni-Cr has a resistivity of about $1.0 \times 10^{-4}$ ohm-cm, and by varying the thickness from about 0.05 to 0.2 microns one can obtain layers having a sheet resistance of about 8 to 40 ohms per square. Layers from about 0.06 to 0.15 microns thickness having a sheet resistivity of about 10 to 35 ohms per square are preferred.

Figure 3E:
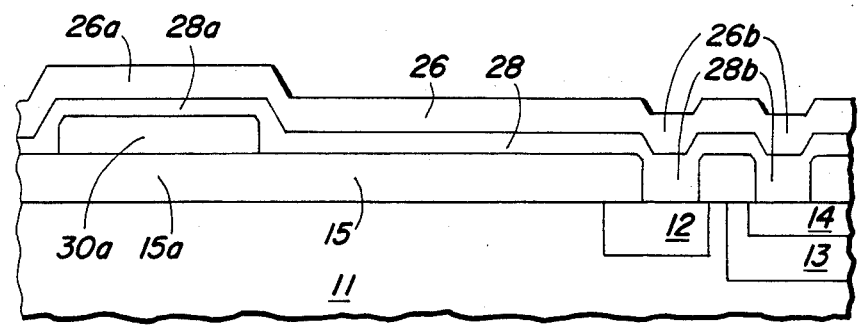
Figure 3F:
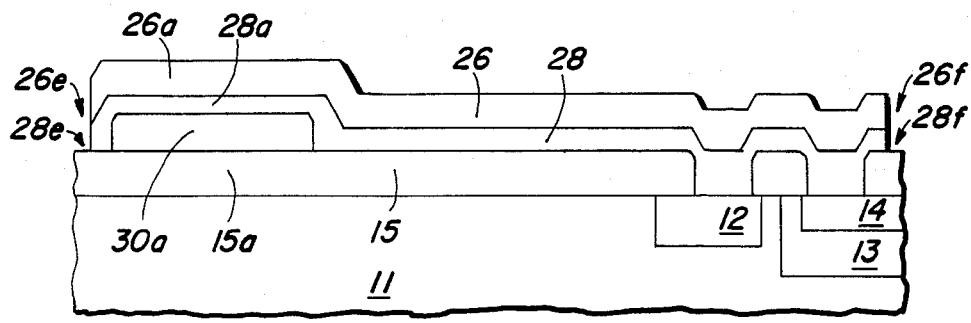
Figure 3G:
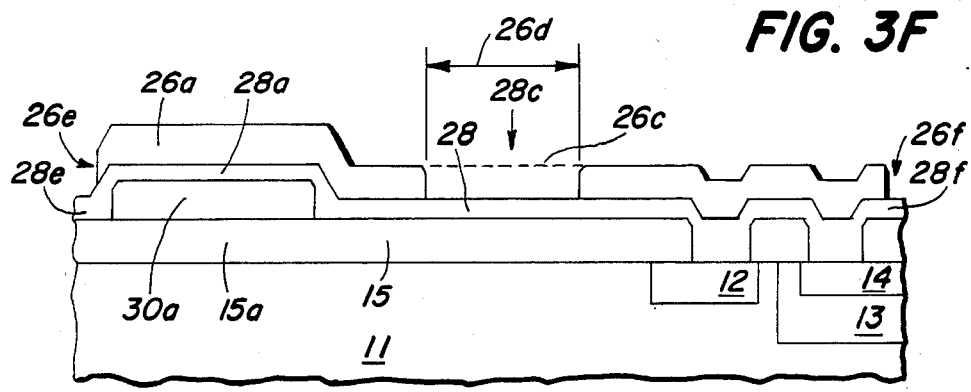

Metallization layer 26 is then applied covering layer 28, as in FIG. 3E. Metallization layer 26 should be of a material convenient for bonding which adheres strongly to resistive barrier layer 28 and which is a good electrical conductor so that current flow among the various contacts to the diffused regions and to and from the contact pads, may take place without appreciable voltage drop in metallization layer 26. Aluminum and gold or gold plus Ti-W are useful for metallization layer 26. It is convenient to use aluminum for layer 26 when layer 28 is of Ni-Cr. Layer 26 is conveniently 0.6 to 3.0 microns thick, but larger or smaller thicknesses may be used provided that the layer is not so thin as to produce substantial resistance. Very thick layers are generally more difficult to fabricate.

It is important that the material of layer 26 and the material of layer 28 have different etch chemistries, so that one can selectively etch away portions of layer 26 without substantially attacking underlying layer 28 and/or etch away portions of layer 28 without substantially attacking layer 26. Al and Ni-Cr have this property.

Figure 3H:
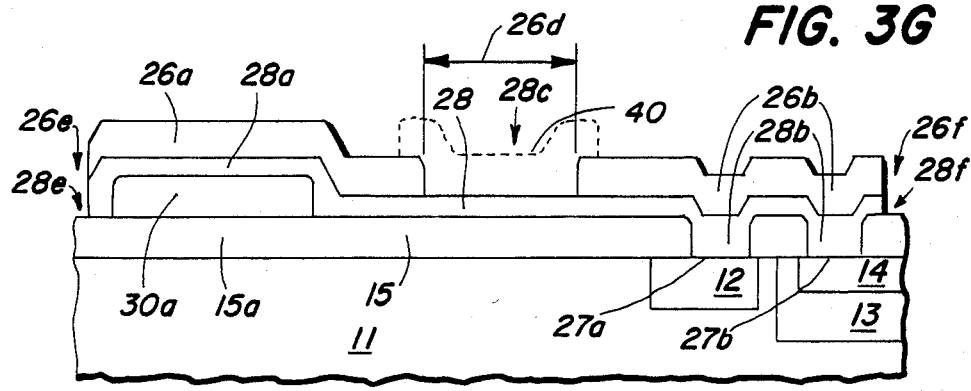

A photoresist mask (not shown) is applied and developed to provide the desired interconnect pattern for metallization layer 26. Techniques for accomplishing this are well-known in the art. Where the structure of FIG. 2A is desired, portions 26e-f and 28e-f (see FIG. 3F) of layers 26 and 28 are removed by etching. The patterned photoresist layer (not shown) is used as a mask for layer 26. After etching away portions 26e-f of layer 26, the remaining portion of layer 26 is used as a mask to etch portions 28e-f of layer 28. The structure shown in FIG. 2A results. Alternatively the photoresist can be used as a mask for etching of both layers 26 and 28.

Where the structure of FIG. 2B is desired, layer 26 is first etched (FIG. 3G) using a patterned photoresist layer (not shown) as a mask to remove portions 26c-f of layer 26. Layer 28 at this point remains unetched and is exposed where layer 26 has been removed, e.g., under locations 26c-f. A second photoresist mask, shown by dotted outline 40 in FIG. 3H, is applied to protect resistor region 28c of layer 28 and the balance of layer 28 is then etched away. Only those portions of layer 28, e.g. portions 28e-f, not protected by metallization layer 26 or resist mask 40 are removed. Photoresist mask 40 need not be precision aligned with the previous layers since its only function is to determine the width of resistor region 28c. The length of resistor region 28c was previously set by gas 26d formed during etching of layer 26. Following etching away of undesired portions of layer 28, photoresist mask 40 is removed by techniques well-known in the art. The structure of FIG. 2B results. Bonding wire 19 is attached to layer 26 in pad region 26a by bond means 19a, using bonding techniques well-known in the art. Bonding means 19a may be a wire bond, as illustrated here, or formed with an etched tape, solder bumps, or other bonding means well-known in the art.

A phosphoric-nitric acid mixture is a suitable etchant for selectively removing aluminum in the presence of Ni-Cr. An etchant for selectively removing Ni-Cr in the presence of aluminum is cerric ammonium nitrate.

Thus, it is apparent that there has been provided in accordance with this invention an improved metallization means and method for electronic devices, particularly semiconductor devices and integrated circuits which must withstand substantial exposure to elevated temperature, in which resistive barrier layers are utilized, in which contact alloying punch-through is reduced without adding additional process steps, and in which bond failure due to bonding pad lifting has been reduced. Further, a means and method has been provided to permit these several objectives to be achieved simultaneously without expensive process modifications.

These embodiments and other variations which differ in detail but which preserve the central relationship among the various elements of the present invention are intended to be included, as fall within the scope of the claims which follow.

We claim:
1. In a process for forming bonding pads suitable for attachment of external bonding means, on an electrical device having a resistive barrier layer beneath said pads and on a substrate, the improvement comprising inserting between said substrate and said resistive barrier layer an adhesion layer comprising a material which forms intermetallic compounds with said resistive barrier layer and comprises an element in common with said substrate.

2. The process of claim 1 wherein said substrate comprises a semiconductor at least partly covered by an insulating layer, and wherein said element is in common with said insulating layer.

3. The process of claim 2 wherein said semiconductor is silicon, said insulator comprises silicon dioxide or silicon nitride, said adhesion layer comprises poly-silicon, and said resistive barrier layer comprises nickel and chromium.

4. A process for making on the same electronic device a high strength bonding pad region and a resistor region, comprising:
   providing a substrate for supporting said bonding pad and said resistor region;
   covering a portion of said substrate with an insulator;
   forming an adhesion layer on a first portion of said insulator corresponding to the desired location of said bonding pad;
   forming a resistive barrier layer at least on said adhesion layer and said insulator;
   forming a bonding layer on said resistive barrier layer;
   patterning said bonding layer to leave said bonding layer at least on said bonding pad region and expose said underlying resistive barrier layer at least in said resistor region;
   patterning said resistive barrier layer to leave said resistive barrier layer at least in said resistor region and under said patterned bonding layer;
   prior to said first forming step, choosing a material for said adhesion layer adapted to form intermetallic compounds with the material of said resistive barrier layer and which has a constituent in common with the material of said insulator; and
   prior to said second forming step, choosing a material for said resistive barrier layer which has a resistivity not less than approximately $1 \times 10^{-4}$ ohm-cm and which is substantially impervious to the interdiffusion of the material of said substrate and the material of said bonding layer at temperatures below about 500° C.

5. The process of claim 4 wherein said substrate comprises silicon, said insulator comprises silicon oxide or nitride or both, said adhesion layer comprise poly-silicon, and said resistive barrier layer comprises nickel and chromium, and wherein said bonding layer comprises aluminum or gold.

* * * * *